US008917140B2

(12) United States Patent  (10) Patent No.: US 8,917,140 B2
Baek et al. (45) Date of Patent: Dec. 23, 2014

(54) APPARATUS AND METHOD FOR IMPROVING EFFICIENCY IN POWER AMPLIFIER

(71) Applicant: Samsung Electronics Co. Ltd., Suwon-si, Gyeonggi-do (KR)

(72) Inventors: Sang-Hyun Baek, Suwon-si (KR); Jae-Hyuk Lee, Sejong-si (KR); Hyung-Sun Lim, Suwon-si (KR); Sung-Youl Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 60 days.

(21) Appl. No.: 13/651,756

(22) Filed: Oct. 15, 2012

(65) Prior Publication Data

US 2013/0093511 A1    Apr. 18, 2013

(30) Foreign Application Priority Data

Oct. 14, 2011 (KR) ........................ 10-2011-0105524

(51) Int. Cl.
*H03F 1/14* (2006.01)
*H03F 3/72* (2006.01)
*H03F 3/60* (2006.01)

(52) U.S. Cl.
CPC . *H03F 3/72* (2013.01); *H03F 3/602* (2013.01)
USPC ........................................ 330/51; 330/124 R

(58) Field of Classification Search
CPC ................ H03F 1/0288; H03F 1/0238; H03F 2200/451; H03F 1/0277; H03F 1/305; H03F 2200/15; H03F 2200/507; H03F 2203/21106; H03F 3/211; H03F 3/68; H03F 2200/504; H03F 3/189; H03F 3/602; H03F 2203/45138; H03F 2200/324; H03F 2200/39; H03F 2200/432; H03F 2200/102; H03F 1/56; H03F 3/195; H03F 2200/198; H03F 1/0205; H03F 1/0266; H03F 3/24; H03F 1/0222; H03F 1/0227; H03F 2200/222; H03F 2200/336

USPC ............... 330/51, 124 R, 127, 136, 295, 297; 455/127.3, 127.4

See application file for complete search history.

(56) References Cited

U.S. PATENT DOCUMENTS

| 6,853,244 | B2* | 2/2005 | Robinson et al. | 330/124 R |
|---|---|---|---|---|
| 7,382,186 | B2* | 6/2008 | Apel et al. | 330/124 R |
| 8,324,965 | B2* | 12/2012 | Meng | 330/124 R |
| 8,604,881 | B2* | 12/2013 | Sankalp et al. | 330/295 |
| 2005/0064830 | A1 | 3/2005 | Grigore | |
| 2012/0068767 | A1* | 3/2012 | Henshaw et al. | 330/127 |

FOREIGN PATENT DOCUMENTS

KR    10-2011-0009815 A    1/2011

OTHER PUBLICATIONS

C.J.L. et al. 'High Average-Efficiency Multimode RF Transmitter Using a Hybrid Quadrature Polar Modulator', IEEE Transactions on Circuits and System S-II: Express Briefs, vol. 55, No. 3, Mar. 2008, pp. 249-253.

(Continued)

*Primary Examiner* — Khanh V Nguyen
(74) *Attorney, Agent, or Firm* — Jefferson IP Law, LLP

(57) ABSTRACT

An apparatus and method for enhancing the whole efficiency of power amplification in a supply modulated amplifier are provided. The power amplification apparatus includes a controller, a Doherty power amplifier, and a supply modulated amplifier. The controller selects a power amplifier among the Doherty power amplifier and the supply modulated amplifier. The Doherty power amplifier amplifies a power of a transmission signal when the Doherty power amplifier is selected by the controller. The supply modulated amplifier amplifies the power of the transmission signal using a supply voltage determined considering the amplitude of the transmission signal, when the supply modulated amplifier is selected by the controller.

28 Claims, 7 Drawing Sheets

(56) References Cited

OTHER PUBLICATIONS

I.K. et al. 'Optimized Envelope Shaping for Hybrid EER Transmitter of Mobile WiMAX—Optimized ET Operation', IEEE Microwave and Wireless Components Letters, vol. 19, No. 5, May 2009, pp. 335-337.

J.M. et al. 'Doherty Amplifier with Envelope Tracking for High Efficiency', IEEE MTT-S International Microwave Symposium Digest, May 23-28, 2010, pp. 1086-1089.

* cited by examiner

APPARATUS AND METHOD FOR IMPROVING EFFICIENCY IN POWER AMPLIFIER

PRIORITY

This application claims the benefit under 35 U.S.C. §119(a) of a Korean patent application filed on Oct. 14, 2011 in the Korean Intellectual Property Office and assigned Serial No. 10-2011-0105524, the entire disclosure of which is hereby incorporated by reference.

BACKGROUND OF THE INVENTION

1. Field of the Invention

The present invention relates to an apparatus and method for improving the efficiency of a power amplifier. More particularly, the present invention relates to an apparatus and method for improving the efficiency of power amplification by improving a supply modulated amplifier. The supply modulated amplifier refers to a power amplifier amplifying an input signal using a supply voltage modulated considering the amplitude of the input signal.

2. Description of the Related Art

Along with the growth of a wireless communication technology, a demand for transmission of various multimedia signals is suddenly increasing. In addition, the growth of the wireless communication technology has increased the demand and need for a fast transmission. As fast transmission is required even in the mobile environment, a concern about a 4th-Generation (4G) communication system is suddenly increasing.

The 4G communication system requires a faster transmission speed, a wider bandwidth, and a higher Peak to Average Power Ratio (PAPR) than an existing communication system provides. According to such requirements, a transmit end of the 4G communication system employs a scheme of amplifying an input signal using a supply voltage modulated considering the amplitude of the input signal. For example, to amplify the input signal using the supply voltage modulated considering the amplitude of the input signal, the transmit end employs an Envelope Elimination and Restoration (EER) amplification scheme, an Envelope Tracking (ET) amplification scheme, a polar amplification scheme, and the like.

A supply modulated amplifier can obtain high efficiency by reducing a power loss through a variation of a supply voltage of a power amplifier dependent on an output power of the power amplifier.

In a case of using the ET amplification scheme, the supply modulated amplifier is constructed as illustrated in FIG. 1.

FIG. 1 illustrates a construction of a supply modulated amplifier according to the related art.

Referring to FIG. 1, the supply modulated amplifier of an ET amplification scheme includes a baseband signal processor 100, an envelope generator 110, a supply modulator 120, a Radio Frequency (RF) processor 130, and a power amplifier 140.

The baseband signal processor 100 generates In-phase/Quadrature-phase (I/Q) data and outputs the I/Q data to the RF processor 130. The RF processor 130 converts the I/Q data provided from the baseband signal processor 100, into an RF signal and provides the RF signal as an input signal of the power amplifier 140.

The envelope generator 110 generates an envelope signal corresponding to the I/Q data provided from the baseband signal processor 100. The supply modulator 120 determines a supply voltage of the power amplifier 140 depending on the envelope signal generated in the envelope generator 110.

The power amplifier 140 amplifies an input signal provided from the RF processor 130 using a supply voltage provided from the supply modulator 120, and outputs the amplified input signal.

As described above, when modulating a supply voltage of the power amplifier depending on an envelope signal corresponding to an input signal of the power amplifier, the supply modulated amplifier can reduce a power loss as illustrated in FIG. 2.

FIGS. 2A and 2B illustrate a supply source of a supply modulated amplifier according to the related art. More specifically, FIG. 2A illustrates an output waveform for a power amplifier receiving an applied fixed supply voltage. FIG. 2B illustrates an output waveform for a supply modulated power receiving an applied supply voltage varied depending on the amplitude of an input signal.

Referring to FIGS. 2A and 2B, the supply modulated amplifier receiving an applied supply voltage varied depending on the amplitude of an input signal can reduce a power loss 210 more than the power amplifier receiving an applied fixed supply voltage. For example, as illustrated in FIGS. 2A and 2B, the power loss 200 for the power amplifier receiving the applied fixed supply voltage is greater than the power loss 210 for the power amplifier receiving an applied supply voltage varied depending on the amplitude of the input signal. The power loss from the power amplifiers may be dissipated as heat.

Generally, the supply modulated amplifier provides a supply source, which is modulated considering the amplitude of a transmission signal, only to a high power amplifier for amplifying a signal of a high power level to enhance the efficiency of a high power level region of high output power. In this case, in a low power level region of low output power, the supply modulated amplifier cannot get the profit of a technology of modulation of a supply voltage of a power amplifier and therefore, needs a way of enhancing the efficiency of power amplification in the low power level region.

Therefore, a need exists for a system and method for improving the efficiency of a power amplifier.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an apparatus and method for improving the efficiency of a power amplifier.

Another aspect of the present invention is to provide an apparatus and method for adding a Doherty power amplifier to a supply modulated amplifier and improving the whole efficiency of power amplification.

Another further aspect of the present invention is to provide an apparatus and method for connecting a supply modulated amplifier and a Doherty power amplifier in parallel and improving the whole efficiency of power amplification.

Yet another aspect of the present invention is to provide an apparatus and method for making selective use of a supply modulated amplifier and a Doherty power amplifier considering an output power of a transmission signal, and amplifying a power of the transmission signal.

The above aspects are achieved by providing an apparatus and method for improving efficiency in a power amplifier.

In accordance with an aspect of the present invention, an apparatus for power amplification in a wireless communication system is provided. The apparatus includes a controller, a Doherty power amplifier, and a supply modulated amplifier. The controller selects a power amplifier among the Doherty power amplifier and the supply modulated amplifier. The Doherty power amplifier amplifies a power of a transmission signal when the Doherty power amplifier is selected by the controller. The supply modulated amplifier amplifies the power of the transmission signal using a supply voltage determined considering an amplitude of the transmission signal, when the supply modulated amplifier is selected by the controller.

In accordance with another aspect of the present invention, a method for amplifying a power of a transmission signal in a transmit end of a wireless communication system including a Doherty power amplifier and a supply modulated amplifier connected in parallel is provided. The method includes selecting a power amplifier for amplifying a power of a transmission signal among the Doherty power amplifier and the supply modulated amplifier, and amplifying the power of the transmission signal using the selected power amplifier.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention describe a technology for enhancing the whole efficiency of power amplification in a supply modulated amplifier. In particular, exemplary embodiments of the present invention relate to an apparatus and method for improving the efficiency of power amplification by adding a Doherty power amplifier to a supply modulated amplifier. The supply modulated amplifier refers to a power amplifier amplifying an input signal using a supply voltage modulated considering the amplitude of the input signal.

In the following description, the supply modulated amplifier uses an Envelope Elimination and Restoration (EER) amplification scheme, an Envelope Tracking (ET) amplification scheme, a polar amplification scheme, and the like.

The following description is made assuming that the supply modulated amplifier employs the ET amplification scheme. However, the supply modulated amplifier can amplify a power of a transmission signal identically even when using the EER amplification scheme and the polar amplification scheme. In the following description, the supply modulated amplifier using the ET amplification scheme is called an envelope tracking power amplifier.

The following description is made assuming improving the whole efficiency of power amplification using a hybrid envelope tracking power amplifier that is a hybrid of an envelope tracking power amplifier and a Doherty power amplifier. In an exemplary embodiment of the present invention, the hybrid envelope tracking power amplifier can be constructed as in FIG. 3.

Figure 1:
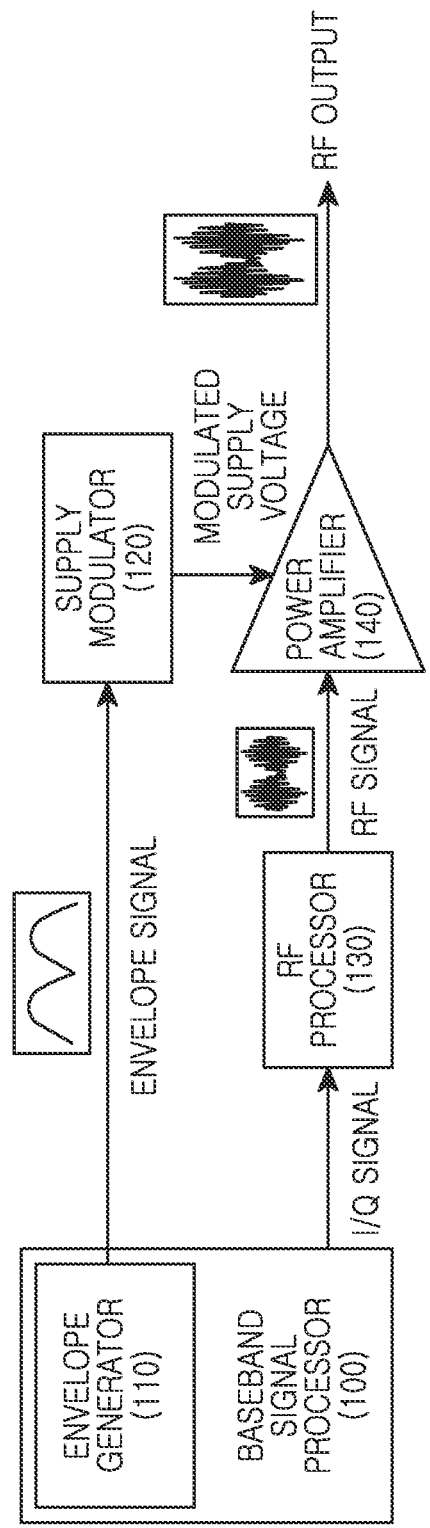
FIG. 1 is a block diagram illustrating a construction of a supply modulated amplifier according to the related art.
Figure 2A:
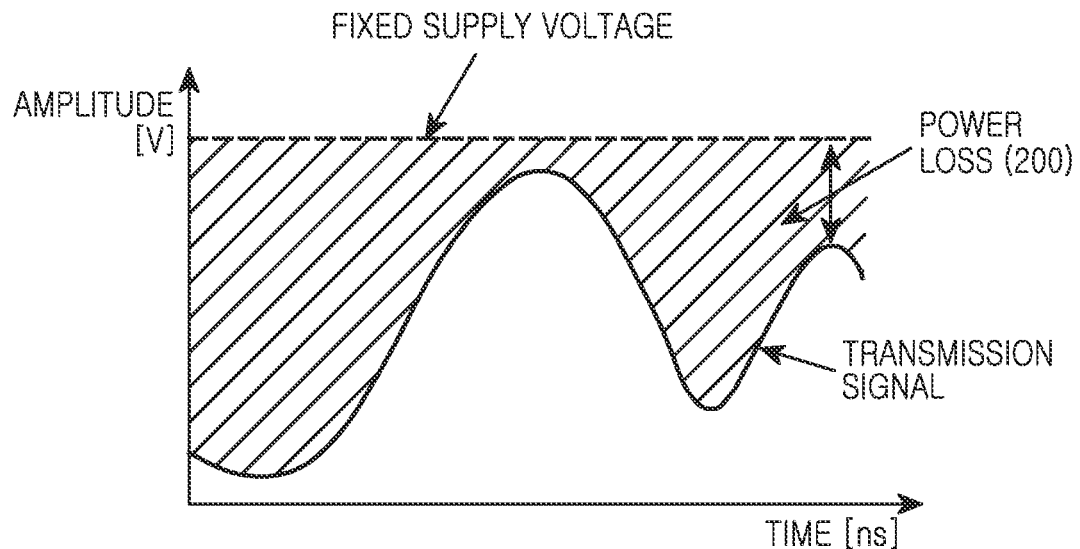
FIGS. 2A and 2B are graphs illustrating a supply source of a supply modulated amplifier according to the related art.
Figure 2B:
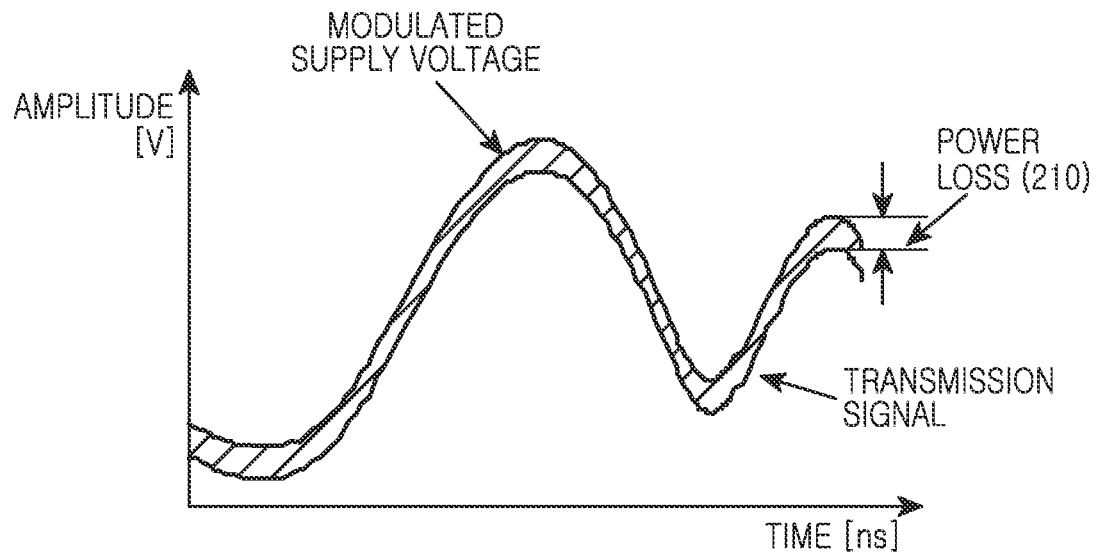
Figure 3:
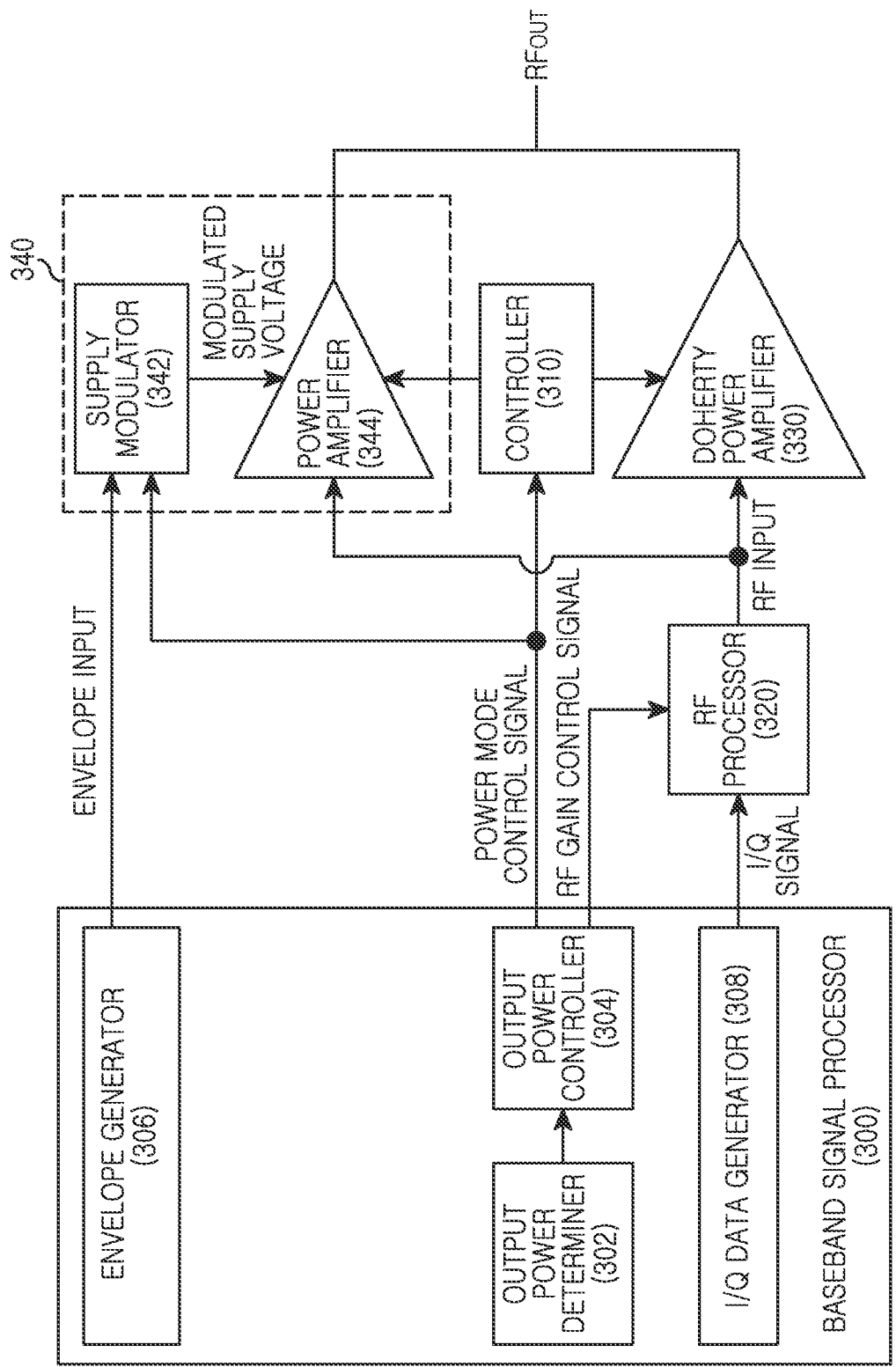
FIG. 3 is a block diagram illustrating a construction of a hybrid envelope tracking power amplifier according to an exemplary embodiment of the present invention.

FIG. 3 illustrates a construction of a hybrid envelope tracking power amplifier according to an exemplary embodiment of the present invention.

Referring to FIG. 3, the hybrid envelope tracking power amplifier includes a baseband signal processor 300, a controller 310, a Radio Frequency (RF) processor 320, a Doherty power amplifier 330, and an envelope tracking power amplifier 340.

The baseband signal processor 300 includes an output power determiner 302, an output power controller 304, an envelope generator 306, and an In-phase/Quadrature-phase (I/Q) data generator 308.

The output power determiner 302 determines an output power level of a transmission signal considering an input power of the transmission signal.

The output power controller 304 generates an RF gain control signal and a power mode control signal dependent on an output power level of a transmission signal determined in the output power determiner 302. For example, the output power controller 304 generates the RF gain control signal dependent on the output power level of the transmission signal determined in the output power determiner 302, and provides the RF gain control signal to the RF processor 320. As another example, the output power controller 304 provides the power mode control signal dependent on the output power level of the transmission signal determined in the output power determiner 302, to the controller 310. In an exemplary embodiment of the present invention, when the output power level of the transmission signal determined in the output power determiner 302 is a high output level, the output power controller 304 generates a power mode control signal controlling to amplify the transmission signal using the envelope tracking power amplifier 340. In contrast, when the output power level of the transmission signal determined in the output power determiner 302 is a middle output level or less, the output power controller 304 generates a power mode control signal controlling to amplify the transmission signal using the Doherty power amplifier 330.

The envelope generator 306 generates an envelope signal corresponding to I/Q data provided from the I/Q data generator 308. After that, the envelope generator 306 amplifies the envelope signal corresponding to the I/Q data considering a gain dependent on an output power level of a transmission signal determined in the output power determiner 302, and transmits the amplified envelope signal to the supply modulator 342. In an exemplary embodiment of the present invention, the envelope generator 306 can be driven only when the envelope tracking power amplifier 340 operates.

The I/Q data generator 308 generates I/Q data of a baseband adapted to the communication standard.

The controller 310 selects a power amplifier for amplifying a power of an RF signal provided from the RF processor 320 among the Doherty power amplifier 330 and the envelope tracking power amplifier 340, depending on a power mode control signal provided from the output power controller 304. For example, when an output power level of a transmission signal is a high output level, the controller 310 controls the envelope tracking power amplifier 340 to amplify the power of the RF signal provided from the RF processor 320. In an exemplary embodiment of the present invention, the controller 310 controls to inactivate the Doherty power amplifier 330 by adjusting a bias circuit of the Doherty power amplifier 330 and cutting off currents introduced into a base terminal of the Doherty power amplifier 330. As another example, when the output power level of the transmission signal is a middle output level or less, the controller 310 controls the Doherty power amplifier 330 to amplify the power of the RF signal provided from the RF processor 320. In an exemplary embodiment of the present invention, the controller 310 controls to inactivate the envelope tracking power amplifier 340 by adjusting a bias circuit of the envelope tracking power amplifier 340 and cutting off currents introduced into a base terminal of the envelope tracking power amplifier 340.

The RF processor 320 converts I/Q data provided from the I/Q data generator 308 into an RF signal according to an RF gain control signal provided from the output power controller 304, and outputs the RF signal to the Doherty power amplifier 330 and the envelope tracking power amplifier 340.

When the Doherty power amplifier 330 is activated according to the control of the controller 310, the Doherty power amplifier 330 amplifies a power of an RF signal provided from the RF processor 320 and outputs the amplified power. For example, the Doherty power amplifier 330 includes a class-AB carrier amplifier and a class-C peaking amplifier. If a power level of an input signal of the Doherty power amplifier 330 is less than a reference value, the Doherty power amplifier 330 amplifies the input signal using only the carrier amplifier. In an exemplary embodiment of the present invention, the peaking amplifier is inactivated. In contrast, when the power level of the input signal of the Doherty power amplifier 330 is greater than the reference value, the Doherty power amplifier 330 amplifies the input signal using the carrier amplifier and the peaking amplifier. As another example, the Doherty power amplifier 330 includes a class-AB carrier amplifier and a class-AB peaking amplifier. In an exemplary embodiment of the present invention, the peaking amplifier is turned On/Off automatically considering a power level of an input signal of the Doherty power amplifier 330. In an example, the peaking amplifier is inactivated together with the envelope tracking power amplifier 340. After that, at a time when the carrier amplifier is saturated, the peaking amplifier is activated to amplify a signal.

The envelope tracking power amplifier 340 includes a supply modulator 342 and a power amplifier 344.

The supply modulator 342 determines a supply voltage of the power amplifier 344 depending on an envelope signal provided from the envelope generator 306. For example, the supply modulator 342 includes a linear amplifier and a switching amplifier. The linear amplifier amplifies the envelope signal provided from the envelope generator 306 and outputs the amplified envelope signal. The switching amplifier supplies necessary currents to an output load of the supply modulator 342 considering a level of currents supplied to an output load from the linear amplifier and a polarity thereof. In an exemplary embodiment of the present invention, the linear amplifier compensates for a shortage amount or access amount of the currents supplied from the switching amplifier.

The power amplifier 344 amplifies an RF signal provided from the RF processor 320 using a supply voltage provided from the supply modulator 342, and outputs the amplified RF signal.

As described above, the Doherty power amplifier 330 includes the carrier amplifier and the peaking amplifier. In an exemplary embodiment of the present invention, the carrier amplifier of the Doherty power amplifier 330 and the peaking amplifier thereof include power cells of different levels. For example, the Doherty power amplifier 330 can be designed such that a power cell of the peaking amplifier is larger than that of the carrier amplifier to magnify an operation region of the Doherty power amplifier 330 at a low output power level and improve the efficiency of power amplification.

In the aforementioned exemplary embodiment of the present invention, the hybrid envelope tracking power amplifier generates an envelope corresponding to I/Q data generated in the I/Q data generator 308, by means of the envelope generator 306 of the baseband signal processor 300.

In another exemplary embodiment of the present invention, the hybrid envelope tracking power amplifier may detect an envelope of I/Q data transmitted from the baseband signal processor 300 to the RF processor 320.

In the aforementioned exemplary embodiment of the present invention, the hybrid envelope tracking power amplifier determines an output power level of a transmission signal considering an input power of the transmission signal.

In an exemplary embodiment of the present invention, the hybrid envelope tracking power amplifier may determine an output power level of a transmission signal considering a final output level of a power amplifier. In this case, the hybrid envelope tracking power amplifier may be constructed as illustrated in FIG. 4.

Figure 4:
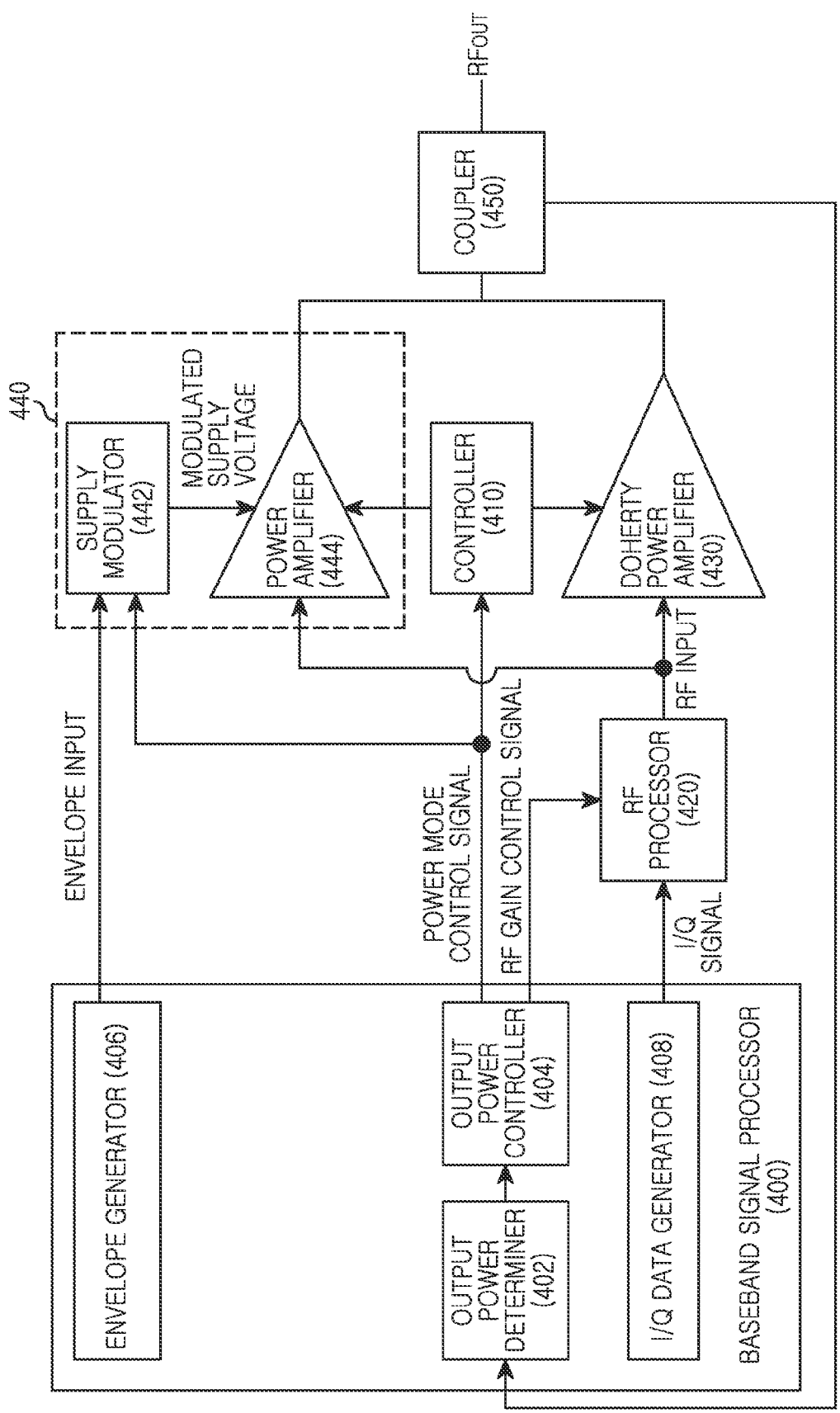
FIG. 4 is a block diagram illustrating a construction of a hybrid envelope tracking power amplifier according to an exemplary embodiment of the present invention.

FIG. 4 is a block diagram illustrating a construction of a hybrid envelope tracking power amplifier according to an exemplary embodiment of the present invention.

Referring to FIG. 4, the hybrid envelope tracking power amplifier includes a baseband signal processor 400, a controller 410, an RF processor 420, a Doherty power amplifier 430, an envelope tracking power amplifier 440, and a coupler 450.

The baseband signal processor 400 includes an output power determiner 402, an output power controller 404, an envelope generator 406, and an I/Q data generator 408.

The output power determiner 402 determines an output power level of a transmission signal to transmit considering a final output power provided through the coupler 450.

The output power controller 404 generates an RF gain control signal and a power mode control signal dependent on an output power level of a transmission signal determined in the output power determiner 402. For example, the output power controller 404 generates the RF gain control signal dependent on the output power level of the transmission signal determined in the output power determiner 402, and provides the RF gain control signal to the RF processor 420. As another example, the output power controller 404 provides the power mode control signal dependent on the output power level of the transmission signal determined in the output power determiner 402, to the controller 410. In an exemplary embodiment of the present invention, when the output power level of the transmission signal determined in the output power determiner 402 is a high output level, the output power controller 404 generates a power mode control signal controlling to amplify the transmission signal using the envelope tracking power amplifier 440. For example, the output power controller 404 generates the power mode control signal controlling to amplify the transmission signal using the envelope tracking power amplifier 440 from a time point when a peaking amplifier of the Doherty power amplifier 430 is saturated. In contrast, when the output power level of the transmission signal determined in the output power determiner 402 is a middle output level or less, the output power controller 404 generates a power mode control signal controlling to amplify the transmission signal using the Doherty power amplifier 430.

The envelope tracking power amplifier 440 includes a supply modulator 442 and a power amplifier 444.

The envelope generator 406 generates an envelope signal corresponding to I/Q data generated in the I/Q data generator 408. After that, the envelope generator 406 amplifies the envelope signal corresponding to the I/Q data considering a gain dependent on an output power level of a transmission signal determined in the output power determiner 402, and transmits the amplified envelope signal to the supply modulator 442. In an exemplary embodiment of the present invention, the envelope generator 406 can be driven only when the envelope tracking power amplifier 440 operates.

The I/Q data generator 408 generates I/Q data of a baseband adapted to the communication standard.

The controller 410 selects a power amplifier for amplifying a power of an RF signal provided from the RF processor 420 among the Doherty power amplifier 430 and the envelope tracking power amplifier 440, depending on a power mode control signal provided from the output power controller 404. For example, when an output power level of a transmission signal is a high output level, the controller 410 controls the envelope tracking power amplifier 440 to amplify the power of the RF signal provided from the RF processor 420. In an exemplary embodiment of the present invention, the controller 410 controls to inactivate the Doherty power amplifier 430 by adjusting a bias circuit of the Doherty power amplifier 430 and cutting off currents introduced into a base terminal of the Doherty power amplifier 430. As another example, when the output power level of the transmission signal is a middle output level or less, the controller 410 controls the Doherty power amplifier 430 to amplify the power of the RF signal provided from the RF processor 420. In an exemplary embodiment of the present invention, the controller 410 controls to inactivate the envelope tracking power amplifier 440 by adjusting a bias circuit of the envelope tracking power amplifier 440 and cutting off currents introduced into a base terminal of the envelope tracking power amplifier 440.

The RF processor 420 converts I/Q data provided from the I/Q data generator 408 into an RF signal according to an RF gain control signal provided from the output power controller 404, and outputs the RF signal to the Doherty power amplifier 430 and the envelope tracking power amplifier 440.

When the Doherty power amplifier 430 is activated according to the control of the controller 410, the Doherty power amplifier 430 amplifies a power of an RF signal provided from the RF processor 420 and outputs the amplified power. For example, the Doherty power amplifier 430 includes a class-AB carrier amplifier and a class-C peaking amplifier. If a power level of an input signal of the Doherty power amplifier 430 is less than a reference value, the Doherty power amplifier 430 amplifies the input signal using only the carrier amplifier. In an exemplary embodiment of the present invention, the peaking amplifier is inactivated. In contrast, when the power level of the input signal of the Doherty power amplifier 430 is greater than the reference value, the Doherty power amplifier 430 amplifies the input signal using the carrier amplifier and the peaking amplifier. As another example, the Doherty power amplifier 430 includes a class-AB carrier amplifier and a class-AB peaking amplifier. In an exemplary embodiment of the present invention, the peaking amplifier is turned On/Off automatically considering a power level of an input signal of the Doherty power amplifier 430. In an example, the peaking amplifier is inactivated together with the envelope tracking power amplifier 440. After that, at a time when the carrier amplifier is saturated, the peaking amplifier is activated to amplify a signal.

The supply modulator 442 determines a supply voltage of the power amplifier 444 depending on an envelope signal provided from the envelope generator 406. For example, the supply modulator 442 includes a linear amplifier and a switching amplifier. The linear amplifier amplifies the envelope signal provided from the envelope generator 406 and outputs the amplified envelope signal. The switching amplifier supplies necessary currents to an output load of the supply modulator 442 considering a level of currents supplied to an output load from the linear amplifier and a polarity thereof. In an exemplary embodiment of the present invention, the linear amplifier compensates for a shortage amount or access amount of the currents supplied from the switching amplifier.

The power amplifier 444 amplifies an RF signal provided from the RF processor 420 using a supply voltage provided from the supply modulator 442, and outputs the amplified RF signal.

As described above, the Doherty power amplifier 430 includes the carrier amplifier and the peaking amplifier. In an exemplary embodiment of the present invention, the carrier amplifier of the Doherty power amplifier 430 and the peaking amplifier thereof include power cells of different levels. For example, the Doherty power amplifier 430 can be designed such that the power cell of the peaking amplifier is larger than that of the carrier amplifier to magnify an operation region of the Doherty power amplifier 430 at a low output power level and improve the efficiency of power amplification.

According to exemplary embodiments of the present invention, the hybrid envelope tracking power amplifier generates an envelope corresponding to I/Q data generated in the I/Q data generator 408, by means of the envelope generator 406 of the baseband signal processor 400.

According to exemplary embodiments of the present invention, the hybrid envelope tracking power amplifier may detect an envelope of I/Q data transmitted from the baseband signal processor 400 to the RF processor 420.

According to exemplary embodiments of the present invention, the hybrid envelope tracking power amplifier is constructed to activate only one of the Doherty power amplifier 430 and the envelope tracking power amplifier 440 according to the control of the controller 310, and amplify an RF signal provided from the RF processor 420.

According to exemplary embodiments of the present invention, the hybrid envelope tracking power amplifier may be constructed to input an output signal of the RF processor 420 selectively to the Doherty power amplifier 430 or the envelope tracking power amplifier 440 depending on an output power level of a transmission signal.

Figure 5:
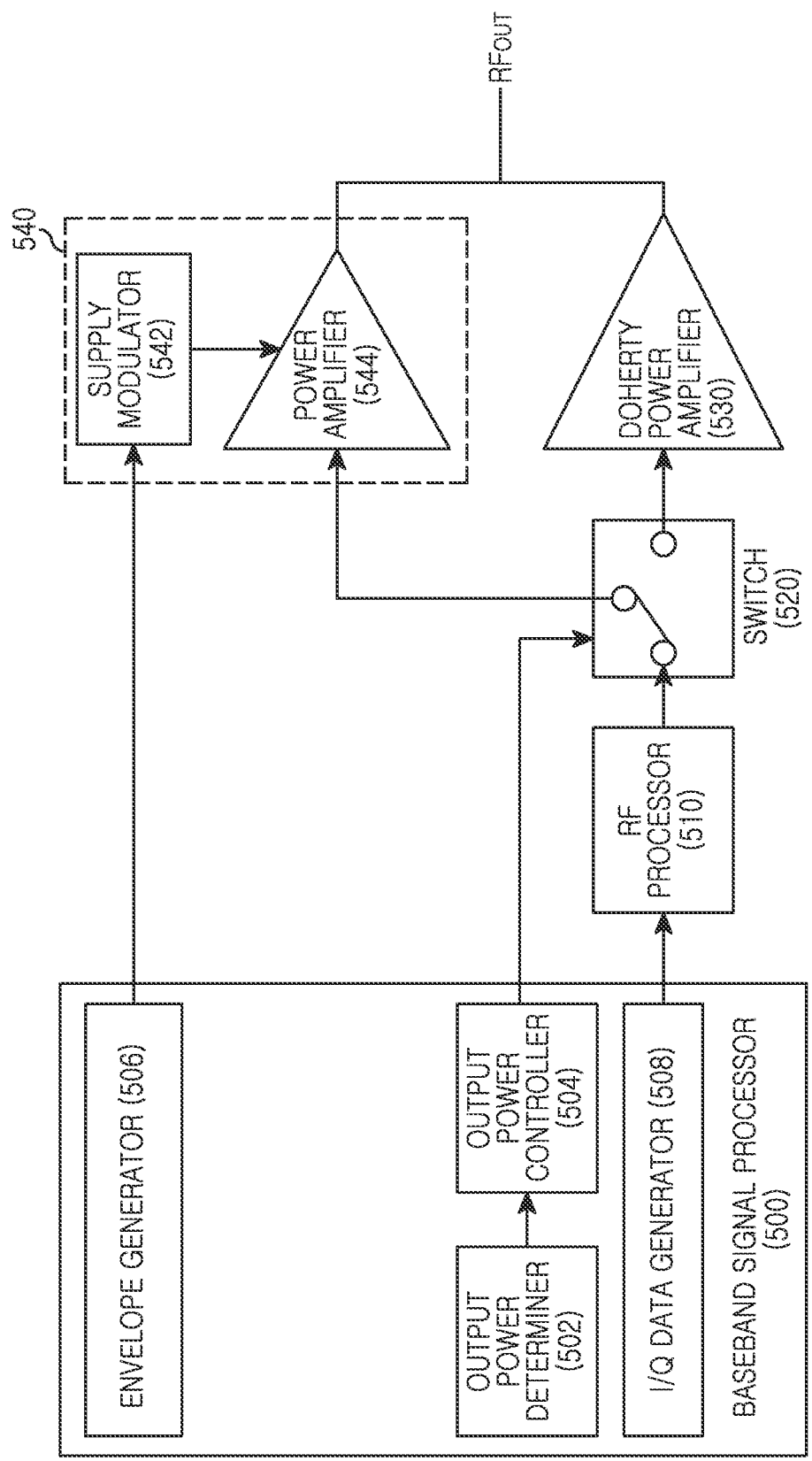
FIG. 5 is a block diagram illustrating a construction of a hybrid envelope tracking power amplifier according to an exemplary embodiment of the present invention.

FIG. 5 is a block diagram illustrating a construction of a hybrid envelope tracking power amplifier according to an exemplary embodiment of the present invention.

Referring to FIG. 5, the hybrid envelope tracking power amplifier includes a baseband signal processor 500, an RF processor 510, a switch 520, a Doherty power amplifier 530, and an envelope tracking power amplifier 540.

The baseband signal processor 500 includes an output power determiner 502, an output power controller 504, an envelope generator 506, and an I/Q data generator 508.

The output power determiner 502 determines an output power level of a transmission signal considering an input power of the transmission signal.

The output power controller 504 generates an RF gain control signal and a power mode control signal dependent on an output power level of a transmission signal determined in the output power determiner 502. For example, the output power controller 504 generates the RF gain control signal dependent on the output power level of the transmission signal determined in the output power determiner 502, and provides the RF gain control signal to the RF processor 510. As another example, the output power controller 504 provides the power mode control signal dependent on the output power level of the transmission signal determined in the output power determiner 502, to the switch 520. In an exemplary embodiment of the present invention, when the output power level of the transmission signal determined in the output power determiner 502 is a high output level, the output power controller 504 generates a power mode control signal controlling to amplify the transmission signal using the envelope tracking power amplifier 540. In contrast, when the output power level of the transmission signal determined in the output power determiner 502 is a middle output level or less, the output power controller 504 generates a power mode control signal controlling to amplify the transmission signal using the Doherty power amplifier 530.

The envelope tracking power amplifier 540 includes a supply modulator 542 and a power amplifier 544.

The envelope generator 506 generates an envelope signal corresponding to I/Q data provided from the I/Q data generator 508. After that, the envelope generator 506 amplifies the envelope signal corresponding to the I/Q data considering a gain dependent on an output power level of a transmission signal determined in the output power determiner 502, and transmits the amplified envelope signal to the supply modulator 542. In an exemplary embodiment of the present invention, the envelope generator 506 can be driven only when the envelope tracking power amplifier 540 operates.

The I/Q data generator 508 generates I/Q data of a baseband adapted to the communication standard.

The RF processor 510 converts I/Q data provided from the I/Q data generator 508 into an RF signal according to an RF gain control signal provided from the output power controller 504, and outputs the RF signal to the switch 520.

The switch 520 provides an RF signal provided from the RF processor 510 to either the Doherty power amplifier 530 or the envelope tracking power amplifier 540 depending on a power mode control signal provided from the output power controller 504. For example, when an output power level of a transmission signal is a high output level, the switch 520 provides the RF signal provided from the RF processor 510, to the envelope tracking power amplifier 540 according to the power mode control signal provided from the output power controller 504. As another example, when the output power level of the transmission signal is a middle output level, the switch 520 provides the RF signal provided from the RF processor 510, to the Doherty power amplifier 530 according to the power mode control signal provided from the output power controller 504.

The Doherty power amplifier 530 amplifies a power of an RF signal provided from the RF processor 510 through the switch 520 and outputs the amplified power. For example, the Doherty power amplifier 530 includes a class-AB carrier amplifier and a class-C peaking amplifier. If a power level of an input signal of the Doherty power amplifier 530 is less than a reference value, the Doherty power amplifier 530 amplifies the input signal using only the carrier amplifier. In an exemplary embodiment of the present invention, the peaking amplifier is inactivated. In contrast, when the power level of the input signal of the Doherty power amplifier 530 is greater than the reference value, the Doherty power amplifier 530 amplifies the input signal using the carrier amplifier and the peaking amplifier. As another example, the Doherty power amplifier 530 includes a class-AB carrier amplifier and a class-AB peaking amplifier. In an exemplary embodiment of the present invention, the peaking amplifier is turned On/Off automatically considering a power level of an input signal of the Doherty power amplifier 530. As an example, the peaking amplifier is inactivated together with the envelope tracking power amplifier 540. After that, at a time when the carrier amplifier is saturated, the peaking amplifier is activated to amplify a signal.

The supply modulator 542 determines a supply voltage of the power amplifier 544 depending on an envelope signal provided from the envelope generator 506. For example, the supply modulator 542 includes a linear amplifier and a switching amplifier. The linear amplifier amplifies the envelope signal provided from the envelope generator 506 and outputs the amplified envelope signal. The switching amplifier supplies necessary currents to an output load of the supply modulator 542 considering a level of currents supplied to an output load from the linear amplifier and a polarity thereof. In an exemplary embodiment of the present invention, the linear amplifier compensates for a shortage amount or access amount of the currents supplied from the switching amplifier.

The power amplifier 544 amplifies an RF signal provided from the RF processor 510 through the switch 520 using a supply voltage provided from the supply modulator 542, and outputs the amplified RF signal.

As described above, the Doherty power amplifier 530 includes the carrier amplifier and the peaking amplifier. In an exemplary embodiment of the present invention, the carrier amplifier of the Doherty power amplifier 530 and the peaking amplifier thereof include power cells of different levels. For example, the Doherty power amplifier 530 can be designed such that the power cell of the peaking amplifier is larger than that of the carrier amplifier to magnify an operation region of the Doherty power amplifier 530 at a low output power level and improve the efficiency of power amplification.

According to exemplary embodiments of the present invention, the hybrid envelope tracking power amplifier generates an envelope corresponding to I/Q data generated in the I/Q data generator 508, by means of the envelope generator 506 of the baseband signal processor 500.

According to exemplary embodiments of the present invention, the hybrid envelope tracking power amplifier may detect an envelope of I/Q data transmitted from the baseband signal processor 500 to the RF processor 510.

The following description is made for a method for amplifying a power of a transmission signal considering an output level of the transmission signal in a hybrid envelope tracking power amplifier.

Figure 6:
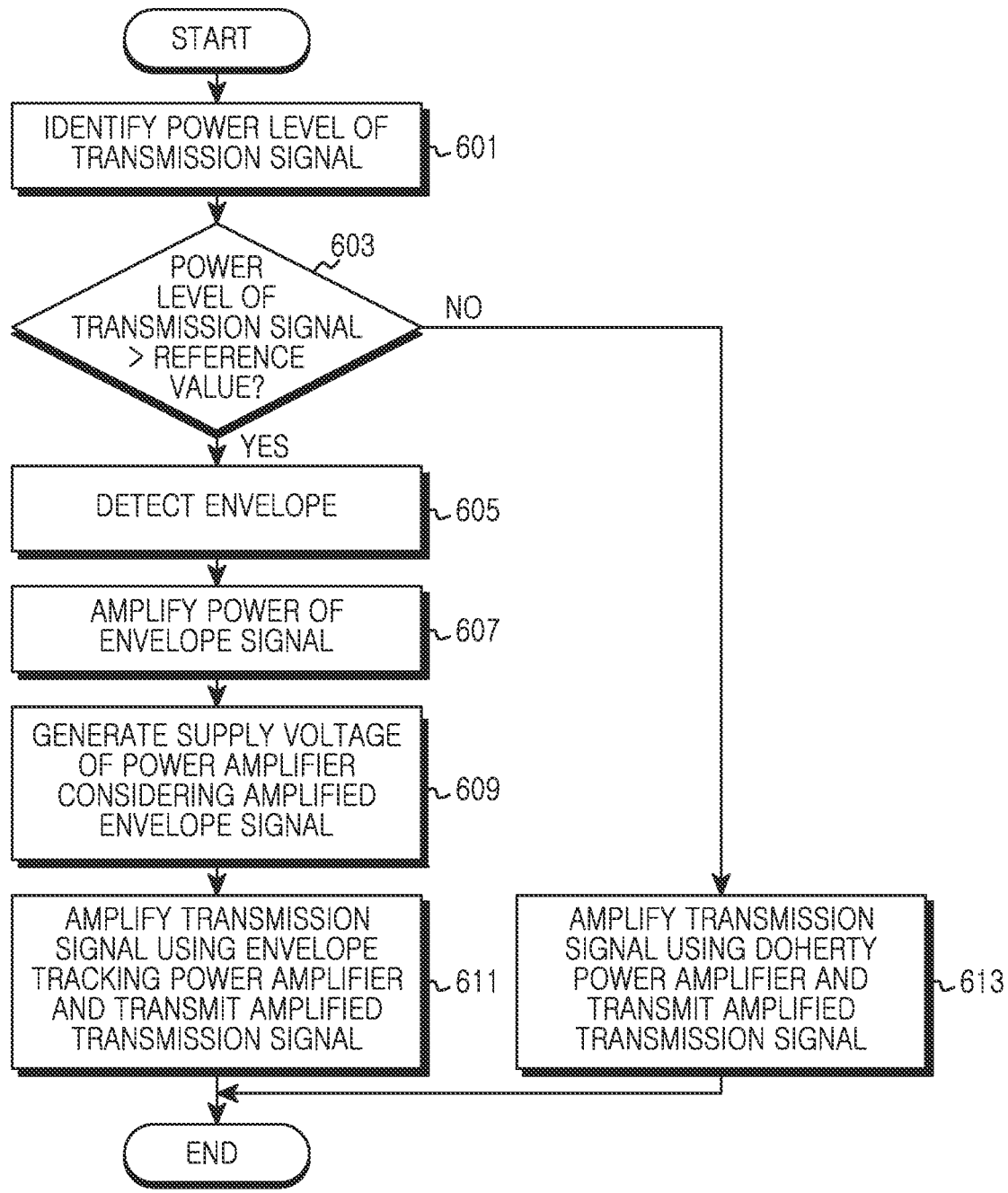
FIG. 6 is a flowchart illustrating a procedure for amplifying a signal in a hybrid envelope tracking power amplifier according to an exemplary embodiment of the present invention.

FIG. 6 is a flowchart illustrating a procedure for amplifying a signal in a hybrid envelope tracking power amplifier according to an exemplary embodiment of the present invention.

Referring to FIG. 6, in step 601, the hybrid envelope tracking power amplifier identifies an output power level of a transmission signal. For example, the hybrid envelope tracking power amplifier determines the output power level of the transmission signal considering an input power of the transmission signal. As another example, the hybrid envelope tracking power amplifier may determine the output power level of the transmission signal to transmit considering a final output power.

After that, the hybrid envelope tracking power amplifier proceeds to step 603. In step 603, the hybrid envelope tracking power amplifier compares the output power level of the transmission signal with a reference value. As an example, the reference value compared with the output power level of the transmission signal includes a reference selecting a power amplifier to be used for amplifying power. For example, when a transmission signal having an output power of a high output level is amplified using an envelope tracking power amplifier and a transmission signal having an output power of a middle output level or less is amplified using a Doherty power amplifier, the reference value compared with the output power level of the transmission signal includes the boundary level between the high output level and the middle output level.

When the hybrid envelope tracking power amplifier determines that the output power level of the transmission signal is greater than the reference value in step 603, the hybrid envelope tracking power amplifier recognizes that it amplifies a power of the transmission signal using the envelope tracking power amplifier. When the hybrid envelope tracking power amplifier determines that the output level of the transmission signal is greater than the reference value, the hybrid envelope tracking power amplifier proceeds to step 605. In step 605, the hybrid envelope tracking power amplifier detects an envelope of the transmission signal. For example, in FIG. 3, the envelope generator 306 of the baseband signal processor 300 generates an envelope signal corresponding to I/Q data generated in the I/Q data generator 308.

After identifying the envelope for the transmission signal in step 605, the hybrid envelope tracking power amplifier proceeds to step 607. In step 607, the hybrid envelope tracking power amplifier amplifies the envelope of the transmission signal considering the output power level of the transmission signal.

Next, the hybrid envelope tracking power amplifier proceeds to step 609. In step 609, the hybrid envelope tracking power amplifier generates a supply voltage of the envelope tracking power amplifier considering the envelope signal amplified in step 607.

After generating the supply voltage of the envelope tracking power amplifier, the hybrid envelope tracking power amplifier proceeds to step 611. In step 611, the hybrid envelope tracking power amplifier amplifies the power of the transmission signal using the supply voltage of the envelope tracking power amplifier, and transmits the amplified power of the transmission signal. For example, in FIG. 3, the power amplifier 344 amplifies a power of an RF signal provided from the RF processor 320 using a supply voltage provided from the supply modulator 342, and outputs the amplified power of the RF signal.

In contrast, when the hybrid envelope tracking power amplifier determines that the output power level of the transmission signal is less than or equal to the reference value in step 603, the hybrid envelope tracking power amplifier recognizes that it amplifies the power of the transmission signal using the Doherty power amplifier. When the hybrid envelope tracking power amplifier determines that the output level of the transmission signal is less than or equal to the reference value, the hybrid envelope tracking power amplifier proceeds to step 613. In step 613, the hybrid envelope tracking power amplifier amplifies the power of the transmission signal using the Doherty power amplifier, and transmits the amplified power of the transmission signal. For example, in FIG. 3, the Doherty power amplifier 330 amplifies a power of an RF signal provided from the RF processor 320 according to the control of the controller 310, and outputs the amplified power of the RF signal.

Next, the hybrid envelope tracking power amplifier terminates the algorithm of the exemplary embodiment of the present invention.

As described above, the hybrid envelope tracking power amplifier amplifies a power of a transmission signal using a power amplifier selected according to an output power level of the transmission signal among an envelope tracking power amplifier and a Doherty power amplifier. In an exemplary embodiment of the present invention, as illustrated in FIG. 3 and FIG. 4, the hybrid envelope tracking power amplifier controls bias circuits of the Doherty power amplifier and the envelope tracking power amplifier so as to activate only one power amplifier among the Doherty power amplifier and the envelope tracking power amplifier and amplify the power of the transmission signal. As another example, as illustrated in FIG. 5, the hybrid envelope tracking power amplifier may input a transmission signal amplifying power to only one power amplifier among the Doherty power amplifier and the envelope tracking power amplifier.

Figure 7:
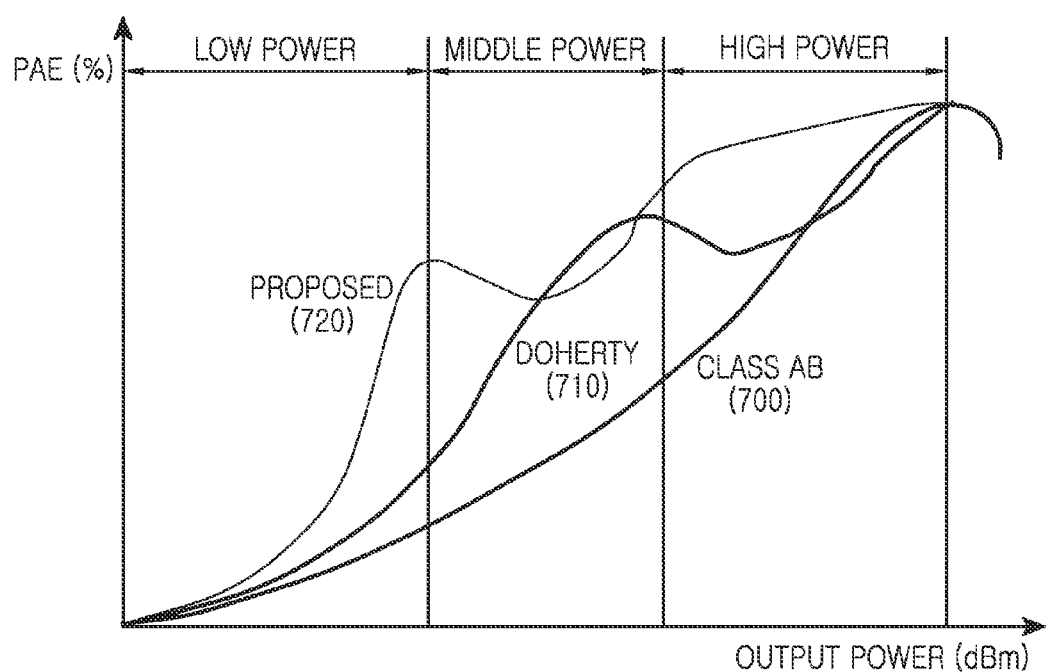
FIG. 7 is a graph illustrating performance variation according to an exemplary embodiment of the present invention.

As described above, the hybrid envelope tracking power amplifier selectively uses the envelope tracking power amplifier and the Doherty power amplifier depending on an output power level of a transmission signal, so as to be able to improve the whole efficiency of power amplification as illustrated in FIG. 7.

FIG. 7 is a graph illustrating performance variation according to an exemplary embodiment of the present invention.

Referring to FIG. 7, when a hybrid envelope tracking power amplifier selectively uses an envelope tracking power amplifier and a Doherty power amplifier depending on an output power level of a transmission signal as denoted by reference numeral 720, the whole efficiency of power amplification is improved relative to when the hybrid envelope tracking power amplifier amplifies the transmission signal using a class-AB power amplifier having a fixed supply voltage as denoted by reference numeral 700.

Also, when the hybrid envelope tracking power amplifier selectively uses the envelope tracking power amplifier and the Doherty power amplifier depending on the output power level of the transmission signal as denoted by reference numeral 720, the whole efficiency of power amplification is improved relative to when the hybrid envelope tracking power amplifier amplifies the transmission signal using only the Doherty power amplifier as denoted by reference numeral 710.

As described above, a hybrid envelope tracking power amplifier, a hybrid of an envelope tracking power amplifier and a Doherty power amplifier, realizes a compensation circuit for Doherty power amplification, a λ/4 transmission line and the like as equivalent models of passive elements on a Monolithic Microwave Integrated Circuit (MMIC) chip. Also, the hybrid envelope tracking power amplifier may realize a circuit for Doherty power amplification on a Surface Mount Device (SMD) or Printed Circuit Board (PCB) module to exclude a factor of efficiency decrease.

As described above, exemplary embodiments of the present invention have an advantage of, by selectively using a supply modulated amplifier and a Doherty power amplifier depending on an output power of a transmission signal and amplifying the transmission signal, being capable of improving the efficiency of power amplification in an operation region wider than an operation region capable of improving the efficiency of power amplification through the supply modulated amplifier.

Also, the exemplary embodiments of the present invention have an advantage of, by improving the whole efficiency of power amplification through a hybrid supply modulated amplifier that is a hybrid of a supply modulated amplifier and a Doherty power amplifier, being capable of reducing power consumption dependent on the amplification of a power of a transmission signal.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for power amplification, the apparatus comprising:
    a controller for selecting a power amplifier among a Doherty power amplifier and a supply modulated amplifier;
    the Doherty power amplifier for amplifying a power of a transmission signal when the Doherty power amplifier is selected by the controller; and
    the supply modulated amplifier for amplifying the power of the transmission signal using a supply voltage determined considering an amplitude of the transmission signal when the supply modulated amplifier is selected by the controller.

2. The apparatus of claim 1, wherein the Doherty power amplifier and the supply modulated amplifier are connected in parallel.

3. The apparatus of claim 1, wherein the controller selects a power amplifier for amplifying the power of the transmission signal among the Doherty power amplifier and the supply modulated amplifier based on an output power of the transmission signal.

4. The apparatus of claim 1, wherein, when an output power of a transmission signal is greater than a reference power, the controller selects the supply modulated amplifier to amplify the transmission signal, and when the output power of the transmission signal is less than the reference power, the controller selects the Doherty power amplifier to amplify the transmission signal.

5. The apparatus of claim 1, wherein the supply modulated amplifier comprises one of an Envelope Elimination and Restoration (EER) power amplifier, an Envelope Tracking (ET) power amplifier, and a polar power amplifier.

6. The apparatus of claim 1, wherein the supply modulated amplifier comprises:
    a supply modulator for generating a supply voltage of a power amplifier considering the amplitude of the transmission signal; and
    the power amplifier for amplifying a power of the transmission signal based on the supply voltage of the power amplifier generated in the supply modulator.

7. The apparatus of claim 1, wherein the Doherty power amplifier comprises a carrier amplifier and a peaking amplifier.

8. The apparatus of claim 7, wherein the carrier amplifier and the peaking amplifier comprise power cells of different levels.

9. The apparatus of claim 1, further comprising:
    an output power controller for comparing an output power of the transmission signal with a reference power, and for generating a power mode control signal for selecting a power amplifier among the Doherty power amplifier and the supply modulated amplifier,
    wherein the controller selects a power amplifier among the Doherty power amplifier and the supply modulated amplifier based on the power mode control signal generated in the output power controller.

10. The apparatus of claim 1, wherein the controller controls bias circuits of the Doherty power amplifier and the supply modulated amplifier, and selects the power amplifier for amplifying the transmission signal.

11. The apparatus of claim 10, wherein, when the supply modulated amplifier is selected to amplify the power of the transmission signal, the controller controls the bias circuits of the Doherty power amplifier and the supply modulated amplifier to activate the supply modulated amplifier and to deactivate the Doherty power amplifier, and
    when the Doherty power amplifier is selected to amplify the power of the transmission signal, the controller controls the bias circuits of the Doherty power amplifier and the supply modulated amplifier to activate the Doherty power amplifier and to deactivate the supply modulated amplifier.

12. The apparatus of claim 1, wherein the controller provides the transmission signal as an input signal to one power amplifier among the Doherty power amplifier and the supply modulated amplifier, based on an output power of the transmission signal.

13. The apparatus of claim 12, wherein, when the supply modulated amplifier is selected to amplify the power of the transmission signal, the controller controls to provide the transmission signal as the input signal to the supply modulated amplifier and to amplify the transmission signal using the supply modulated amplifier, and
    when the Doherty power amplifier is selected to amplify the power of the transmission signal, the controller controls to provide the transmission signal as the input signal to the Doherty power amplifier and to amplify the transmission signal using the Doherty power amplifier.

14. The apparatus of claim 1, wherein the controller selects the power amplifier among the Doherty power amplifier and the supply modulated amplifier based on whether an output power of the transmission signal is greater than a reference power.

15. A method for amplifying a power of a transmission signal in a transmit end of a wireless communication system comprising a Doherty power amplifier and a supply modulated amplifier, the method comprising:

selecting a power amplifier for amplifying a power of a transmission signal among the Doherty power amplifier and the supply modulated amplifier; and amplifying the power of the transmission signal using the selected power amplifier.

16. The method of claim 15, wherein the Doherty power amplifier and the supply modulated amplifier are connected in parallel.

17. The method of claim 15, wherein the selecting of the power amplifier comprises:

selecting a power amplifier for amplifying the power of the transmission signal among the Doherty power amplifier and the supply modulated amplifier, based on an output power of the transmission signal.

18. The method of claim 17, wherein the selecting of the power amplifier comprises:

when the output power of the transmission signal is greater than a reference power, selecting the supply modulated amplifier, and when the output power of the transmission signal is less than the reference power, selecting the Doherty power amplifier.

19. The method of claim 15, wherein the supply modulated amplifier comprises:

one of an Envelope Elimination and Restoration (EER) power amplifier, an Envelope Tracking (ET) power amplifier, and a polar power amplifier.

20. The method of claim 15, wherein the supply modulated amplifier comprises:

a supply modulator for generating a supply voltage of a power amplifier considering the amplitude of the transmission signal; and the power amplifier for amplifying the power of the transmission signal based on the supply voltage of the power amplifier generated in the supply modulator.

21. The method of claim 15, wherein the Doherty power amplifier comprises a carrier amplifier and a peaking amplifier.

22. The method of claim 21, wherein the carrier amplifier and the peaking amplifier comprise power cells of different levels.

23. The method of claim 15, wherein the amplifying of the power of the transmission signal comprises:

when the supply modulated amplifier is selected, controlling a bias circuit of the supply modulated amplifier to activate the supply modulated amplifier and controlling a bias circuit of the Doherty power amplifier to deactivate the Doherty power amplifier; and amplifying the power of the transmission signal using the supply modulated amplifier.

24. The method of claim 15, wherein the amplifying of the power of the transmission signal comprises:

when the Doherty power amplifier is selected, controlling a bias circuit of the Doherty power amplifier to activate the Doherty power amplifier and controlling a bias circuit of the supply modulated amplifier to deactivate the envelope tracking power amplifier; and amplifying the power of the transmission signal using the Doherty power amplifier.

25. The method of claim 15, wherein the amplifying of the power of the transmission signal comprises:

when the supply modulated amplifier is selected, providing the transmission signal to the supply modulated amplifier; and amplifying the power of the transmission signal using the supply modulated amplifier.

26. The method of claim 15, wherein the amplifying of the power of the transmission signal comprises:

when the Doherty power amplifier is selected, providing the transmission signal to the Doherty power amplifier; and amplifying the power of the transmission signal using the Doherty power amplifier.

27. The method of claim 15, wherein the amplifying of the power of the transmission signal comprises:

when the supply modulated amplifier is selected, determining an amplitude of the transmission signal;

generating a supply voltage of the power amplifier based on the amplitude of the transmission signal; and amplifying the power of the transmission signal based on the supply voltage.

28. The method of claim 15, wherein the selecting of the power amplifier comprises, selecting the power amplifier among the Doherty power amplifier and the supply modulated amplifier based on whether an output power of the transmission signal is greater than a reference power.

* * * * *